United States Patent
McCune, Jr. et al.

(10) Patent No.: US 7,636,386 B2
(45) Date of Patent: Dec. 22, 2009

(54) METHOD OF CONTINUOUSLY CALIBRATING THE GAIN FOR A MULTI-PATH ANGLE MODULATOR

(75) Inventors: Earl W. McCune, Jr., Santa Clara, CA (US); Wendell B. Sander, Los Gatos, CA (US)

(73) Assignee: Panasonic Corporation, Osaka (JP)

( * ) Notice: Subject to any disclaimer, the term of this patent is extended or adjusted under 35 U.S.C. 154(b) by 734 days.

(21) Appl. No.: 11/280,665

(22) Filed: Nov. 15, 2005

(65) Prior Publication Data

US 2007/0109066 A1    May 17, 2007

(51) Int. Cl.
H04B 1/38 (2006.01)
H04L 5/16 (2006.01)
H04L 27/10 (2006.01)
H04L 27/18 (2006.01)

(52) U.S. Cl. .................. 375/223; 375/271; 375/345; 332/127

(58) Field of Classification Search .......... 375/223, 375/271, 345; 332/127
See application file for complete search history.

(56) References Cited

U.S. PATENT DOCUMENTS

| 4,755,774 | A |   | 7/1988 | Heck .................... 332/18 |
| 5,028,887 | A |   | 7/1991 | Gilmore .................. 331/8 |
| 5,120,997 | A | * | 6/1992 | Cantwell ................. 327/79 |
| 5,130,676 | A |   | 7/1992 | Mutz .................... 332/100 |
| 5,483,203 | A |   | 1/1996 | Rottinghaus ............. 331/10 |
| 5,673,007 | A |   | 9/1997 | Kirisawa ................ 331/18 |
| 5,781,044 | A | * | 7/1998 | Riley et al. ............ 327/105 |
| 5,940,457 | A |   | 8/1999 | Dreifuss et al. ......... 375/376 |
| 5,952,895 | A | * | 9/1999 | McCune et al. .......... 332/128 |
| 6,094,101 | A |   | 7/2000 | Sander et al. ........... 331/17 |
| 2006/0103462 | A1 | * | 5/2006 | Capofreddi et al. ...... 330/86 |

FOREIGN PATENT DOCUMENTS

| WO | WO 99/07065 | 2/1999 |
| WO | WO 01/20774 A1 | 3/2001 |

* cited by examiner

*Primary Examiner*—Curtis B Odom (57) ABSTRACT

A multiple path angle modulator includes a closed secondary loop added to a main control loop to automatically adjust a scaling factor related to high frequency gain. The main control loop is configured as a primary path to process the low frequency portion of the angle modulation signal, and the secondary loop is configured as an auxiliary path to process the high frequency portions of the angle modulation signal. The secondary loop senses calibration information and uses it to continuously calibrate the gain within the modulation loop in real time while the system performs its primary operation, thereby eliminating the need for a system shut down or calibration specific timing, such as a lapse time, to balance the modulation paths. Calibration is continuously performed as a background process. The angle modulator is applicable to all modulation type systems.

43 Claims, 6 Drawing Sheets

METHOD OF CONTINUOUSLY CALIBRATING THE GAIN FOR A MULTI-PATH ANGLE MODULATOR

FIELD

The present application relates to the field of angle or phase modulation of a carrier signal.

BACKGROUND

Angle or phase modulators are typically used in digital transmitters to encode messages in the phase of the output signal from the transmitter. High speed links require a large modulation bandwidth in the phase modulator. One method of modulation is to configure a single wide band loop so that all the modulation is performed inside the loop. In this manner, the loop stabilizes around the modulation. The main problem with using a single wide band loop is that a lot of noise is present. To address such a noise problem, a dual path modulation system can be used. This dual path modulation system typically keeps the main loop relatively narrow so that the noise can be controlled. However, using a narrow band main loop leaves fairly wide band modulations where the higher frequencies outside the main loop still have to be calibrated so that the overall gain is flat.

One dual-path method to is to use an angle or phase modulating system including a phase locked loop and apply the phase information to the main loop reference while simultaneously applying modulation directly to an analog voltage controlled oscillator used for the transmitter signal. The main loop reference is also called a direct path. The modulation is applied to a voltage controlled oscillator (VCO) via an auxiliary modulation path separate from the direct path. The variations in analog circuitry result in a mismatch between the phase indicated by the auxiliary modulation path and the phase indicated by the direct path. This variation must be calibrated.

Figure 1:
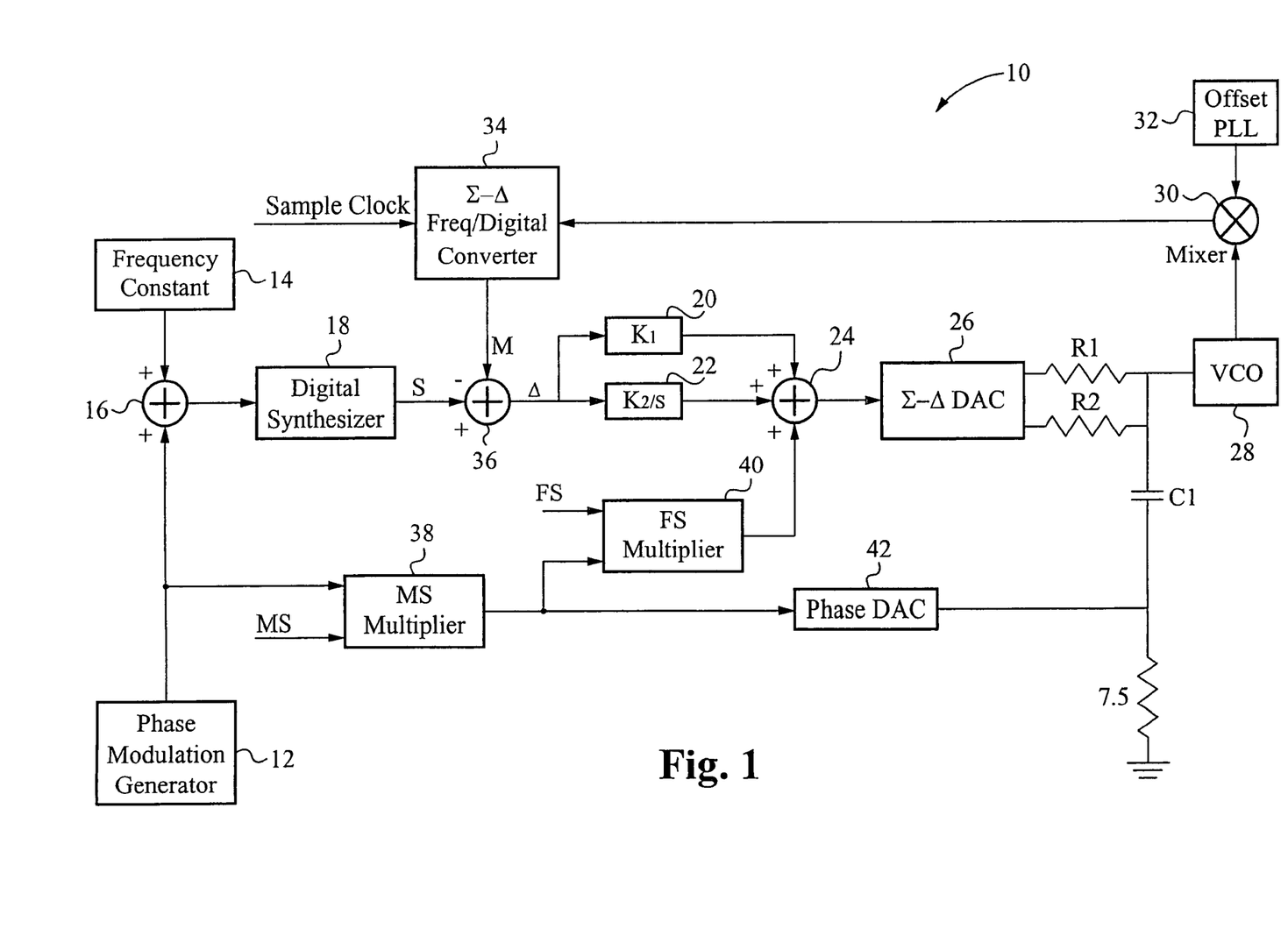
FIG. 1 illustrates an exemplary block diagram of a conventional dual path angle modulator.

FIG. 1 illustrates an exemplary block diagram of a conventional dual path angle modulator 10 as described in U.S. Pat. No. 6,094,101, which is incorporated herein by reference. The output of the main loop VCO 28 is mixed, via mixer 30, with the output of an offset PLL 32 to produce an IF (intermediate frequency) output signal frequency equal to the difference between the main loop VCO frequency and the offset loop frequency. The IF output signal is the feed back signal needed to measure the output phase and is processed in the remainder of the circuitry, which is all digital, to produce a control signal for the main loop VCO 28. The main loop VCO 28 produces the desired output signal phase. The digital circuitry has two paths, one low frequency path directly through the loop and a high frequency path with a scaling gain of MS. The scaling factor MS is adjusted for flat overall frequency response, and provides for balancing of the gain among the low-frequency, or direct, path and the high-frequency, or auxiliary, modulation path. Determination and application of the proper value of MS requires a calibration procedure.

During the calibration procedure, a known modulation signal is applied and the output is measured. Referring to FIG. 1, the known modulation signal is generated by the phase modulation generator 12, which is applied to the digital synthesizer 18 to output the signal S. An analog to digital converter (ADC) 34, such as a Sigma-Delta frequency to digital converter, provides a measured signal M which is a digital representation of the analog frequency output from the VCO 28. A logic circuit 36 receives the signal S and the signal M, and outputs an error signal $\Delta$ representing the frequency error between the signal S and the signal M. The error signal $\Delta$ is filtered using a digital filter, represented as the K1 block 20 and the K2/s block 22 in FIG. 1. The output of the K1 block 20 is a frequency error signal and the output of the K2/s block 22 is a phase error signal. The frequency error signal and the phase error signal are directed to a DAC 26 via a summing logic circuit 24. The scaling factor FS is used to add angle modulation waveform to the frequency error signal and the phase error signal via the summing logic circuit 24. The output signal of the DAC 26 is applied through resistors R1 and R2 to an integrating capacitor C1. The voltage stored on the integrating capacitor C1 is applied to the VCO 28.

The auxiliary modulation path is used to modify a modulation voltage applied to the VCO 28 in the main loop. The modulation signal generated by the phase modulation generator 12 is applied to a modulation DAC 42 via an MS multiplier 38. The MS multiplier 38 applies the scaling factor MS to the modulation signal. An output signal of the modulation DAC 42 is applied to the VCO 28 via the integrating capacitor C1. The modulating signal of the auxiliary path is scaled by the gain parameter MS, via the MS multiplier 38, and also scaled by the scaling factor FS, via the FS multiplier 40, and applied to the main loop at the summing logic circuit 24.

Achieving accurate wide bandwidth angle modulation in a phase locked loop is difficult. The method of using two or more paths to impress the phase information on the phase locked loop VCO is an established method. However, VCOs tend to drift and DACs also introduce inaccuracies. The gains in each of the two paths have to match. If the gain of the auxiliary modulation path (the path through which the higher frequencies pass) is too high, then too much modulation is applied to the VCO. If the gain of the auxiliary modulation path is too low, then there is insufficient modulation on the VCO. The means for balancing these two modulation paths has conventionally been achieved using a calibration procedure that focuses just on this calibration issue. The calibration procedure is either done manually using swept frequency techniques or done automatically using special calibration signals. However, such approaches are intrusive to the normal operation of such an angle or phase modulator because the calibration procedure can not be performed while the system is in operation. Instead, operation of the system must be suspended, and only during such a lapse time can the calibration procedure be performed.

Many conventional systems are designed to operate in bursts, which provide the necessary lapse time to perform the calibration procedure. Examples of such systems include GSM systems, other cellular networks, or any network using TDMA (time division multiple access). A transmitter included within such a system operates in a stand-by mode for a portion of the time. When it is time to transmit, the transmitter is awakened from stand-by mode, a calibration procedure is executed, the transmission is made, and the transmitter goes back to stand-by mode.

However, in newer generation systems, such as CDMA (code division multiple access), the transmitter is operating at all times, and there are no natural periods or intervals of down time where a calibration procedure can be performed. It is critical to the operation of a dual path modulator that both paths have exactly the same gain, so calibration of the two paths is still necessary.

In a conventional dual path angle modulator, if gains are wrong in the forward path of the control loop, then the entire signal is normalized within the control loop, including noise. A current practice is to make the bandwidth very wide so that the control loop automatically normalizes the entire wide band modulation signal. This practice yields a lot of noise in the output signal. As wider signal bandwidths are utilized, such as for wideband CDMA and wireless LAN, the resulting noise becomes impractical.

SUMMARY

The present application is directed to a multiple path angle modulator in which a closed secondary loop is added to a main control loop to automatically adjust a scaling factor related to high frequency gain to the angle modulation. This improves conventional dual path modulators and provides a real time method for balancing the two or more phase modulation paths in a closed loop phase modulator. This is done by taking advantage of the fact that the desired phase modulation signal is distributed in frequency such that components fall into the frequency response of all the modulation paths. Any subsequent discussion referring to frequency or phase refers in general to frequency, phase, and phase differential, where appropriate. The main control loop can be configured as a primary path to process the low frequency portion of the phase modulation signal, and the secondary loop is configured as an auxiliary path to process the high frequency portions of the phase modulation signal. The secondary loop senses calibration information and uses it to calibrate the gain within each loop. In alternative embodiments, additional auxiliary paths are configured to further de-couple the frequency spectrum.

The two or more phase modulation paths are balanced when the output phase of a phase locked loop VCO in the main control loop exactly matches the input phase, thereby meeting calibration requirements for the gain in each path. As applied herein, a varying frequency input signal can be applied to the multiple path angle modulator. As such, the term "a phase lock loop" refers generally to "a frequency control loop" and "a phase control loop" since the circuit is not restricted to being "locked" to a single frequency or phase.

The output phase is detected or measured and compared to the input or desired phase. The difference signal between these two phase signals is determined and used to systematically adjust the gain of each of the paths until the detected or measured output signal phase matches the input signal phase. The low frequency path is fixed and is used to maintain control of the center frequency of the output signal from the VCO.

In contrast to conventional dual path angle modulators that require a lapse time to perform a calibration procedure, the described angle modulator continuously calibrates each path while the system performs its primary operation. In other words, the angle modulator described in this application uses a calibration process running in the background during normal operations, thereby eliminating the need for a system shut down or calibration specific timing, such as a lapse time, to balance the modulation paths. In other systems that require a lapse time, a command is required to initiate the calibration procedure. Within the system as presently described, calibration is continuously performed as a background process. The presently described angle modulator is applicable to many, if not all, modulation type systems including, but not limited to, the GSM system described in background above, a wireless LAN, a radar, a phased-array, any CDMA-based system, and any TDMA-based system.

In one aspect, a modulating circuit includes a phase control loop and a modulating loop. The phase control loop outputs an analog angle modulation signal in response to an input desired angle modulation signal. The phase control loop includes a difference logic circuit to receive as input a first bit stream representing the desired angle modulation signal and a second bit stream representing the analog angle modulation signal and to output an output bit stream representing a difference quantity between the first bit stream and the second bit stream, and a controlled oscillator to output the analog angle modulation signal. The modulating loop is coupled to receive the output bit stream from the difference logic circuit and coupled to an input terminal of the controlled oscillator. The modulation loop includes a modulation gain circuit to receive the output bit stream and to automatically output a gain parameter, and a multiplier to receive as input the gain parameter and an input bit stream representing the desired angle modulation signal and to output a calibrating modulation signal to the input terminal of the controlled oscillator. The phase control loop also includes a control circuit to receive the output bit stream from the difference logic circuit and to output a filtered analog difference signal. The input terminal of the controlled oscillator includes a summing circuit to receive as input the filtered analog difference signal from the control circuit and the calibrating modulation signal from the multiplier. The modulation gain circuit can comprise a gate circuit and an accumulator. The gain parameter comprises an accumulated value within the accumulator representative of the accumulated difference quantities output by the difference logic circuit. The gate circuit can comprise an exclusive OR gate or an AND gate. The accumulator can be configured to adjust a rate by which the difference quantity converges towards zero. The gate circuit can utilize an absolute value of a magnitude of the difference quantity output by the difference logic circuit. The gate circuit can comprise a qualifier and a FIR filter. The modulation gain circuit can comprise an accumulator and a through gate.

In another aspect, a modulating circuit comprises a phase control loop to output an analog angle modulation signal in response to an input desired angle modulation signal and a modulating loop coupled to the forward portion of the phase control loop. A forward portion of the phase control loop includes a control circuit to receive as input a bit stream representing a difference quantity between the analog angle modulation signal and the desired angle modulation signal and to output a filtered analog difference signal, and a controlled oscillator to output the analog angle modulation signal. The modulation loop includes a modulation gain circuit to receive the bit stream representing the difference quantity between the analog angle modulation signal and the desired angle modulation signal and to automatically output a gain parameter, and a multiplier to receive as input the gain parameter and an input bit stream representing the desired angle modulation signal and to output a calibrating modulation signal. The controlled oscillator receives as input the calibrating modulation signal and the filtered analog difference signal. The forward portion of the phase control loop can comprise a summing circuit to receive the calibrating modulation signal and the filtered analog difference signal and to output a controlling signal to the controlled oscillator. The phase control loop can include a difference logic circuit to receive as input a first bit stream representing the desired angle modulation signal and a second bit stream representing the analog angle modulation signal and to output the output bit stream representing the difference quantity between the analog angle modulation signal and the desired angle modulation signal to the control circuit. The modulation gain circuit can comprise a gate circuit and an accumulator. The gain parameter comprises an accumulated value within the accumulator representative of the accumulated difference quantities output by the difference logic circuit. The gate circuit can comprise an exclusive OR gate or an AND gate. The accumulator can be configured to adjust a rate by which the difference quantity converges towards zero. The gate circuit can utilize an absolute value of a magnitude of the difference quantity output by the difference logic circuit. The gate circuit can comprise a qualifier and a FIR filter. The modulation gain circuit can comprise an accumulator and a through gate.

In yet another aspect, a modulating circuit comprises a controlled oscillator to output an analog angle modulation signal, a digital synthesizer to receive an input desired angle modulation signal and to output a first digital bit stream representing the angle modulation signal, a difference logic circuit coupled to receive the first digital bit stream from the digital synthesizer and a second digital bit stream representing the analog angle modulation signal, wherein the difference logic circuit outputs an output bit stream representing a difference quantity between the analog angle modulation signal and the desired angle modulation signal, a control circuit coupled to the difference logic circuit to receive the output bit stream, wherein the control circuit outputs a filtered analog difference signal, a modulation gain circuit coupled to the difference logic circuit to receive the output bit stream, wherein the modulation gain circuit outputs a gain parameter, a multiplier coupled to receive an input bit stream representing the desired angle modulation signal and coupled to the modulation gain circuit to receive the gain parameter, wherein the multiplier outputs a calibrating modulation signal, and a summing circuit coupled to the control circuit to receive the filtered analog difference signal and coupled to the multiplier to receive the calibrating modulation signal, wherein the summing circuit outputs a control signal to the controlled oscillator. The controlled oscillator, the difference logic circuit, the control circuit, and the summing circuit form a phase control loop. The output bit stream from the difference logic circuit drives a forward path of the phase control loop. The difference logic circuit, the modulation gain circuit, the multiplier, and the summing circuit form a modulation loop. The modulation loop is coupled to the forward path of the phase control loop. The modulation gain circuit automatically determines the modulation gain such that a direct modulation gain of the phase control loop and a gain of the modulation loop are substantially equal. The modulation gain circuit can comprise a gate circuit and an accumulator. The accumulator outputs the gain parameter. An accumulated value representative of the accumulated difference quantities output by the difference logic circuit comprises the gain parameter. The gate circuit can comprise an exclusive OR gate, wherein the exclusive OR gate utilizes a sign and a magnitude of the difference quantity output by the difference logic circuit. The gate circuit can also comprise an AND gate, wherein the AND gate can utilize either a positive magnitude of the difference quantity output by the difference logic circuit or a negative magnitude of the difference quantity output by the difference logic circuit. The accumulator can be configured to adjust a rate by which the difference quantity converges towards zero. The gate circuit can be configured to utilize an absolute value of a magnitude of the difference quantity output by the difference logic circuit. The gate circuit can comprises a qualifier and a FIR filter. The modulation gain circuit can comprise an accumulator and a through gate. The difference logic circuit outputs a signal representing at least one of a frequency difference and a phase difference between the desired angle modulation signal and the analog angle modulation signal. The desired angle modulation signal can comprise a wideband angular modulation signal.

In still yet another aspect, a modulating circuit comprises means for generating an analog angle modulation signal, means for generating an output bit stream representing a difference quantity between the analog angle modulation signal and an input desired angle modulation signal, means for adapting the output bit stream into a filtered analog difference signal, means for automatically determining a gain parameter in response to the output bit stream, means for multiplying the input desired angle modulation signal by the gain multiplier to generate a calibrating modulation signal, and means for combining the calibration modulation signal and the filtered analog signal into an input signal for the means for generating the analog angle modulation signal, wherein the means for generating the analog angle modulation signal generates the analog angle modulation signal in response to the input signal.

BRIEF DESCRIPTION OF THE SEVERAL VIEWS OF THE DRAWINGS

The present application is described relative to the several views of the drawings. Where appropriate and only where identical elements are disclosed and shown in more than one drawing, the same reference numeral will be used to represent such identical elements.

DETAILED DESCRIPTION

Embodiments of the present application are described herein in the context of an apparatus and method for continuously calibrating the gain for a multi-path angle modulator. Those of ordinary skill in the art will realize that the following detailed description of the present application is illustrative only and is not intended to be in any way limiting. Other embodiments of the present application will readily suggest themselves to such skilled persons having the benefit of this disclosure.

Reference will now be made in detail to implementations of the present application as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In accordance with the present application, some of the components, process steps, and/or data structures may be implemented using various types of digital systems, including hardware, software, or any combination thereof. In addition, those of ordinary skill in the art will recognize that devices of a less general purpose nature, such as hardwired devices, field programmable gate arrays (FPGAs), application specific integrated circuits (ASICs), or the like, may also be used without departing from the scope and spirit of the inventive concepts disclosed herein.

The dual path angle modulator of the present application is configured to de-couple a narrow band including the center frequency from the wide band signal, and design the main control loop to process the narrow band signal. The forward path of the main control loop is said to be a low frequency path. An auxiliary modulation loop, or high frequency path, is coupled to the main control loop to process the remaining portion of the wide band signal not processed by the main control loop. However, tuning the sensitivity in the VCO of the main control loop can lead to a variance, sometimes in a substantial manner. This can leave a mismatch of gains between the main control loop and the auxiliary modulation loop. Sometimes the gain in the auxiliary modulation loop is too high, sometimes too low. The dual path angle modulator provides a means for automatically sensing when the gain is too low and increasing it, or when the gain is too high and decreasing it.

One concept applied to this system is that when the gain normalization is exactly correct in the dual-path angle modulator, then the output signal is exactly the desired input signal. A feedback signal M is a digital representation of the analog output signal from the VCO. A directly synthesized signal S is a digital representation of the desired input signal. An error signal $\Delta$ is determined as the difference between the signal S and the signal M. When the output signal of the dual path angle modulator is exactly the desired input signal, the error signal $\Delta$ is zero. Even though circuit artifacts such as phase noise keep this from being true at all times, over the long term, the error signal $\Delta$ continuously converges towards zero. The gain scaling factor MS is applied to the high frequency path. A second feed-forward scaling factor FS is fixed and determined by the operational requirements of the output circuit.

If there is a non-zero value for the long term average of the error signal $\Delta$, then there is an error in the high frequency path gain MS. Further, the direction and magnitude of this gain error is discernable from the long term average of the error signal $\Delta$. Thus, correction of this gain error is achieved to an arbitrary accuracy using a feedback loop within the auxiliary modulation path. The input to this loop is the error signal $\Delta$, and the output is the high frequency path gain parameter MS. A valuable aspect to the dual path angle modulator is that the originally input modulation waveform is unimportant. The automatic correction operates in the presence of an arbitrary modulation waveform, which allows it to operate during normal system operation. There is no need for external calibration modes, nor for breaks in normal operation to perform or update the calibration information. This system makes this gain normalization transparent to the user.

Figure 2:
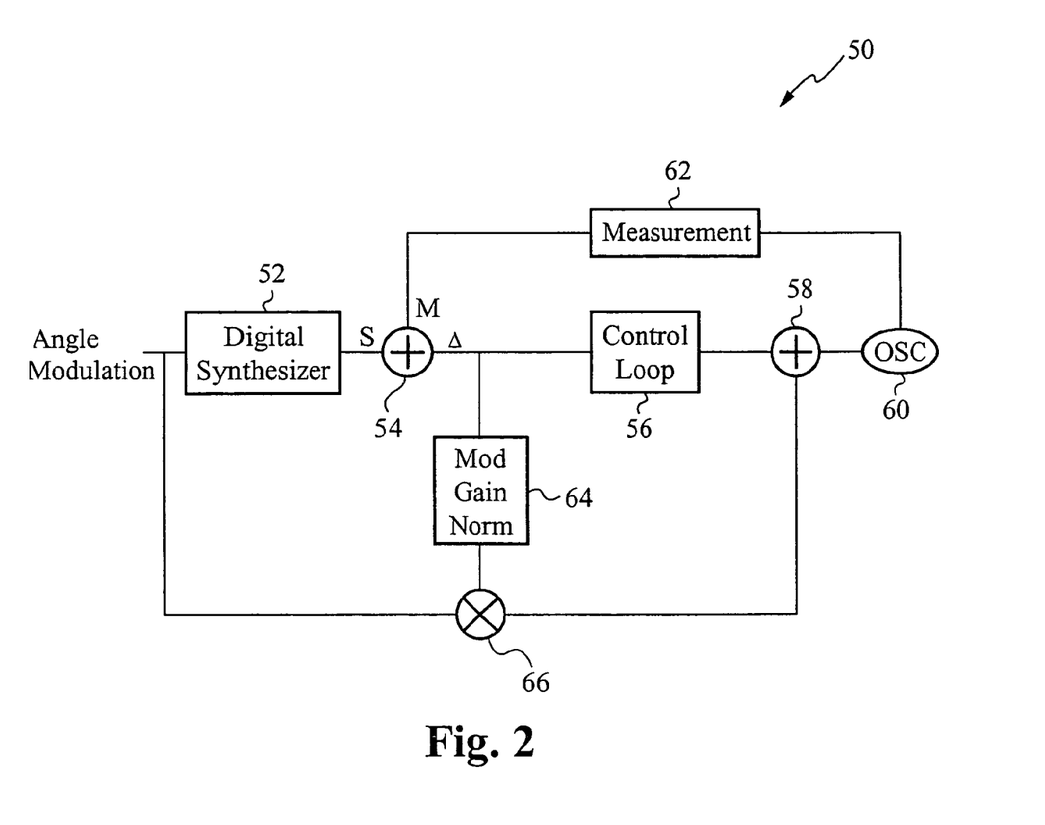
FIG. 2 illustrates a conceptual block diagram of a dual path angle modulator.

FIG. 2 illustrates a generalized block diagram of the dual path angle or phase modulator. The dual path angle modulator 50 includes a primary control loop and a secondary, or auxiliary, modulation loop. The primary loop includes a phase locked loop with a VCO 60 that generates an analog output signal. The analog output signal is provided as feedback to a difference logic circuit 54. The difference logic circuit 54 outputs the error signal $\Delta$. The secondary loop includes a modulation gain normalizing block 64 that automatically and continuously determines the gain parameter MS based on the error signal $\Delta$. The mean of the error signals $\Delta$ are zero. In other words, if the analog output signal from the VCO 60 is exactly the same as the desired input signal, then the error signal $\Delta$ is zero. The gain parameter MS is the high frequency gain parameter used to match the gain between the primary control loop and the secondary modulation loop. One function of the dual path angle modulator 50 is to measure an error between an output signal and a desired signal, and to make an adjustment based on the measured error.

Figure 3:
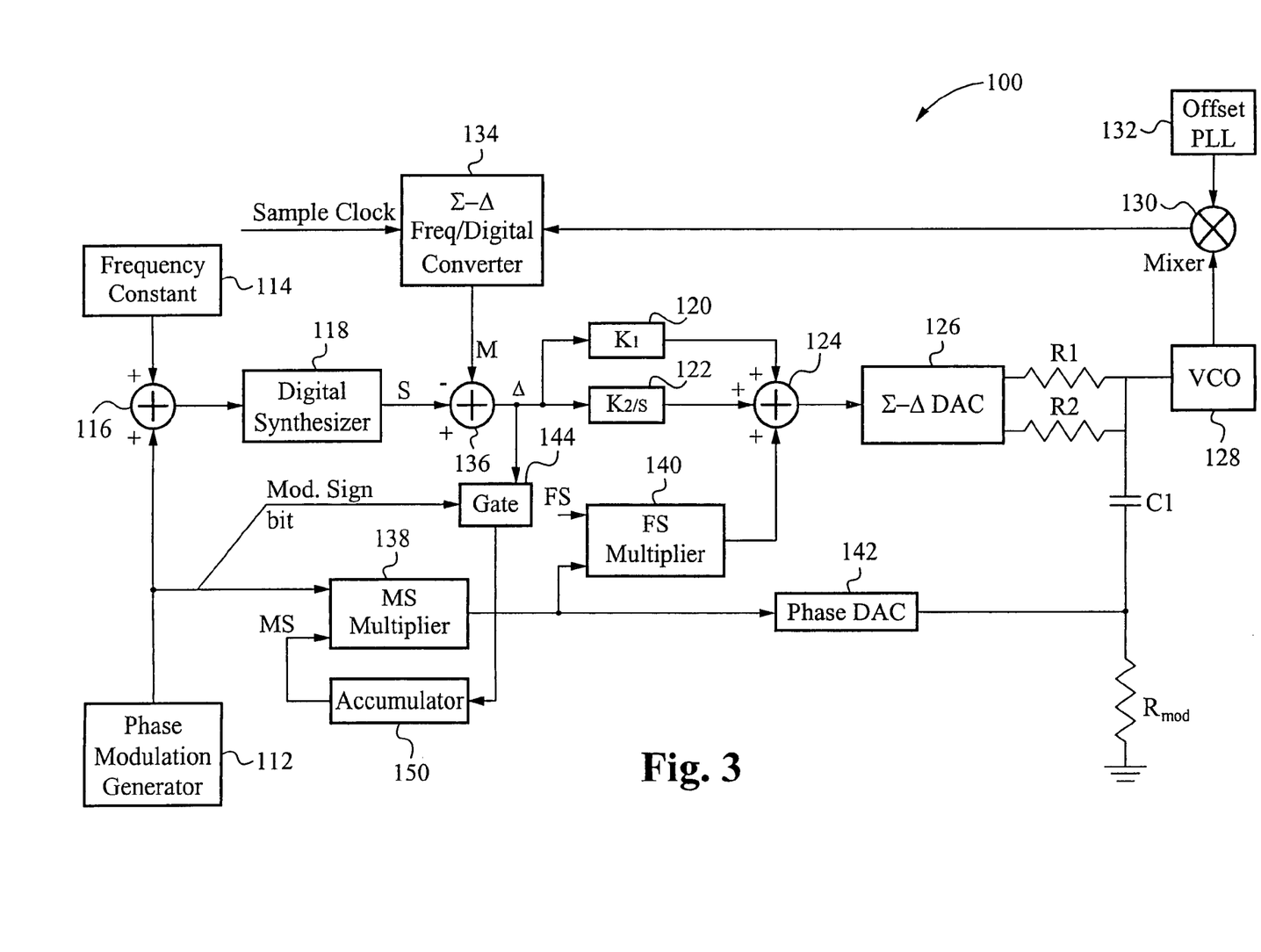
FIG. 3 illustrates a block diagram of a first embodiment of the dual path angle modulator.

FIG. 3 illustrates a block diagram of a first embodiment of the dual path angle modulator 100 of the present application. The dual path angle modulator 100 of FIG. 3 is similar to the dual path angle modulator 10 of FIG. 1 with the addition of the auxiliary modulation loop that includes a gate 144 and a processing circuit 150 to provide a feedback loop within the auxiliary modulation path. In this first embodiment, the modulation gain normalization block 64 of FIG. 2 comprises the gate 144 and the processing circuit 150. The dual path angle modulator 100 is an embodiment of the apparatus for performing the measurement and adjustment functions described above in relation to FIG. 2. In this embodiment, the processing circuit 150 is an accumulator. The error signal $\Delta$ includes a sign and some measure of magnitude over time. The gate 144 can take various embodiments that take advantage of different combinations and usages of the signs and magnitudes. For example, an XOR gate utilizes both sign and magnitude, and converges very quickly. An AND gate only looks at one sign, such as only processing positively signed values while ignoring negatively signed values. The AND gate converges less quickly than the XOR gate. A THROUGH option ignores sign and only uses the magnitude. The output of the gate is a modified error signal $\Delta'$.

The accumulator 150 accumulates the modified error signals $\Delta'$. The numbers (error signals $\Delta'$) going to the accumulator 150 are negative when the gain is too low. If the gain is too high, then the numbers are positive, which indicates that there is too much gain in the forward path. The modulation is a zero-mean process because the accumulator 150 accumulates errors both positive and negative, so there is guaranteed convergence to an accumulated value within the accumulator 150. This accumulated value is the gain parameter MS. As the accumulator 150 converges towards the gain parameter MS, the error signal $\Delta$ heads towards zero. When the error signal $\Delta$ is zero, the value in the accumulator 150 corresponds to the optimal gain parameter MS. Only when the error signal $\Delta$ equals zero does the accumulator 150 stop. Design options can be utilized to define how fast or slow the system converges. As an example, if it is determined that the measuring process has more noise, then the system may be set to converge more slowly.

Referring to FIG. 3, the frequency constant block 114 represents a carrier signal. A modulation is generated by the phase modulation generator 112, which is added to the carrier signal, via the summing circuit 116, to generate a desired input signal. The digital synthesizer 118 converts the desired input signal to a numeric stream, the desired input signal S. The K1 block 120 and the K2/s block 122 act as digital filters. The signal coming out of the K1 block 120 is the frequency error and the signal coming out of the K2/s block 122 is the phase error. The error signal $\Delta$ is also directed to the gate 144, which provides the modified error signal $\Delta'$ to the accumulator 150. The FS multiplier 140 and the Sigma Delta DAC 126 function similarly as in FIG. 1. The configuration of the resistors and the capacitors are exemplary, and can take other embodiments. The dual path angle modulator 100 of FIG. 3 modifies the structure of FIG. 1 in such a way that the gain parameter MS is automatically determined without need for an external process and on an on-going basis. The MS multiplier 138 receives the gain parameter MS from the accumulator 150 to scale the modulation in the forward path of the auxiliary modulation loop. The gain parameter MS also influences the gain in the main control loop, as the scaled modulation signal output from the MS multiplier 138 is used as an input to the FS multiplier 140.

The analog output signal from the VCO 128 is provided as feedback and converted to the digital signal M by the analog to digital converter 134. The analog to digital converter 134 can be a Sigma Delta frequency to digital converter. Both signal S and signal M have full bandwidth information, including the modulation. The K1 digital filter 120 and the K2/s digital filter 122 in the main control loop function as a low pass filter. The main control loop processes the narrow band center frequency, but the information related to high bandwidth errors are present in the error signal $\Delta$. This error information is processed within the gate 144 and the accumulator 150 to determine the gain parameter MS.

As expected, if the gain parameter MS is low, then the high frequency gain is also low. Similarly, if the gain parameter MS is too high, then the high frequency gain is also high. Of importance here is the observation that the error in the frequency response flattens as directly related to the error in the value of the gain parameter MS.

As an example, if the gain parameter MS is too low, then the signal M does not equal the desired signal S. As a result, the high frequency modulation components of the signal M do not subtract completely the high frequency modulation components from the signal S, and so an error signal $\Delta$ results. Since there is not enough high frequency components on this error signal $\Delta$, the value stored within the accumulator 150 ramps up, making the gain parameter MS larger. The increased gain parameter MS is applied to the forward path of the auxiliary modulation loop, which acts to increase the normalized modulator gain up toward the normalized condition. Likewise, if the gain parameter MS is increased too high, then too much high frequency modulation is coming in on the signal M. In this case, the error signal $\Delta$ reflects that the gain is too high and the value in the accumulator 150 ramps down, making gain parameter MS smaller.

As shown in FIG. 3, the gate 144 operates on the error signal $\Delta$. Variations in the implementation of the gate 144 yields different performance for the dual path angle modulator 100. Some options already identified are described in greater detail below. If the gate 144 is an exclusive-OR (XOR) gate, then the signed error signal $\Delta$ is sampled with normalized modulation using all samples of the error signal. Using the XOR gate, the accumulator 150 determines the value of MS according to:

$$MS_{j+1} = MS_j + \alpha sgn(S_j)\Delta_j$$

A scaling factor $\alpha$ is a linear gain term, where $\alpha = 2^{-k}$, (k>0). The value k represents the number of most significant bits set to zero within the accumulator 150, which is explained in greater detail below.

If the gate 144 is an AND gate, only half the error signal $\Delta$ is output from the gate 144 and applied to the accumulator 150. In other words, half the error information is utilized. The AND gate outputs all positively signed error signal $\Delta$ values, and all negatively signed error signal $\Delta$ values are ignored. Alternatively, the AND gate outputs all negatively signed error signal $\Delta$ values, and all positively signed error signal $\Delta$ values are ignored. Use of the AND gate takes longer for the gain parameter MS to converge since only half the information is used. Using the AND gate, the accumulator 150 can determine the value of MS according to:

$$MS_{j+1} = MS_j + \alpha\Delta_j \quad S_j > 0$$
$$MS_j + 0 \quad S_j \leq 0$$

The gate 144 can also be a simple wire, previously referred to as a THROUGH gate, where the error signal $\Delta$ passes directly to the accumulator 150. This is less effective but does eventually converge. In this case, all samples of the error signal $\Delta$ are used, and modulation information is ignored such that the accumulator determines the value of MS according to:

$$MS_{j+1} = MS_j + \alpha\Delta_j$$

Figure 4:
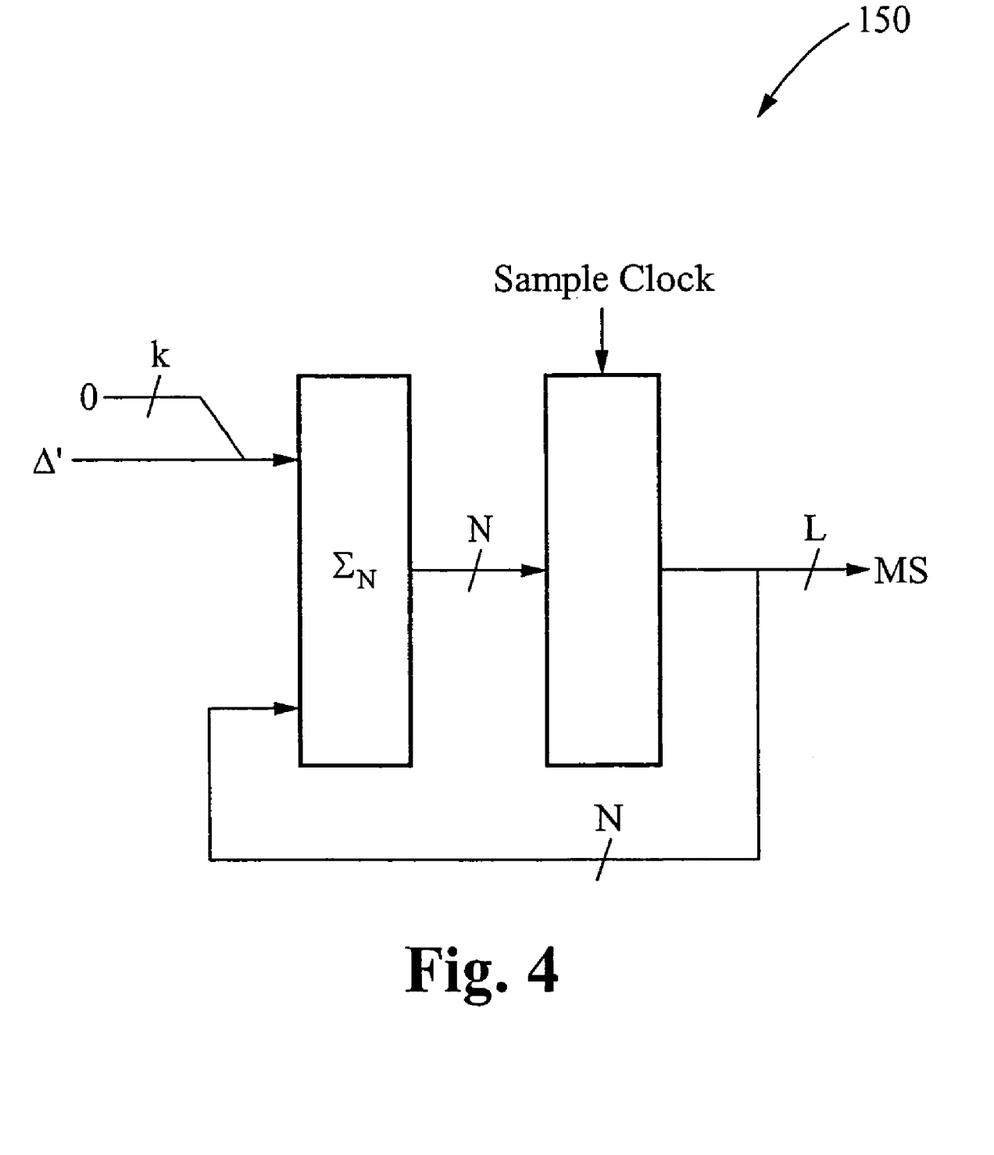
FIG. 4 illustrates an exemplary block diagram of the accumulator included in the dual path angle modulator of FIG. 3.

FIG. 4 illustrates an exemplary block diagram of the accumulator 150 included in the dual path angle modulator 100 of FIG. 3. The difference measurements output from the gate 144, e.g the modified error signal $\Delta'$, enter the accumulator 150 on the least significant bits. The higher significant bits are set to zero. As shown in FIG. 4, the symbol k defines the number of higher significant bits. By controlling the value of k, the rate at which the accumulator 150 converges is controlled. Increasing k is accomplished by setting the value of the more higher significant bits to zero. This acts to slow down the convergence of the accumulator 150. In other words, the speed of the accumulator 150 is controlled by increasing the number of higher significant bits set to zero, which slows down the accumulator 150, or by reducing the number of higher significant bits set to zero, which speeds up the accumulator 150.

The accumulator 150 can perform some filtering by only taking the top L most significant bits as the gain parameter MS. L is determined as a design practice based on how much filtering is desired and how fast the accumulator 150 is to respond. By entering the modified error signal $\Delta'$ as the least significant bits within the accumulator 150, and then taking the gain parameter value from the most significant bits, a natural filtering function is achieved.

The automatic calibration loop converges to the correct gain parameter MS independent of the initial state of the accumulator 150. This is true even if the signal to noise ratio of the feedback signal M is poor. Noisy inputs result in a slight wandering of the desired gain parameter MS, causing distortion in the desired modulation and degrading signal quality measurements such as EVM. Accordingly, the automatic calibration loop could be designed to both sense that convergence is occurring, and also to narrow its loop bandwidth when converged. Narrowing the loop bandwidth is achieved by slowing down the correction variation rate within the accumulator 150.

There are a wide variety of methods by which the loop bandwidth can be narrowed to slow down its correction variation rate. One is to increase the value of k in FIG. 5, making the scale factor $\alpha$ a variable. Another is to only operate on every $K^{th}$ sample of $\Delta$ (decimating $\Delta$ by K). A third is to filter D using either FIR (finite input response) or IIR (infinite input response) methods described below, or to change the parameters of such filters if they are already being used such that the resulting filter bandwidth is narrower than before.

Figure 5:
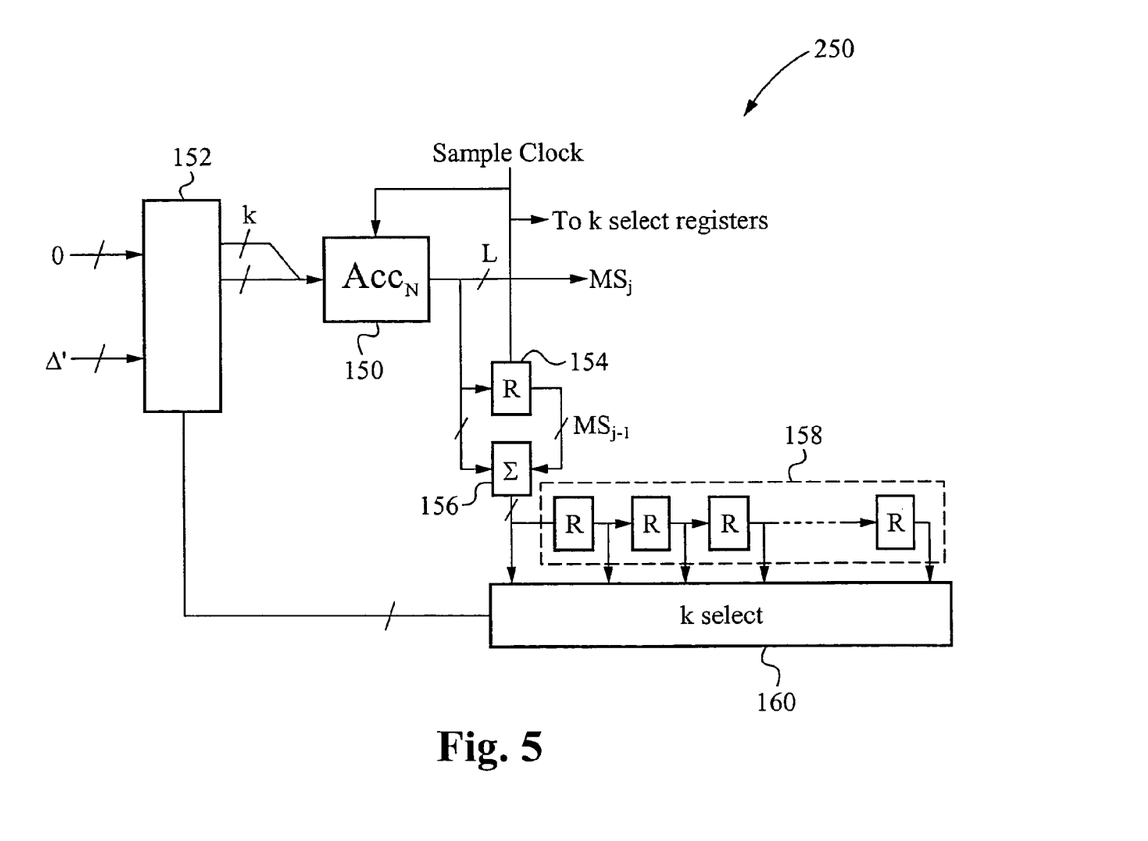
FIG. 5 illustrates an expanded accumulator with convergence management.

The detection of loop convergence about the proper value of the gain parameter MS is detected by an expanded accumulator 250 such as that illustrated in FIG. 5. The expanded accumulator 250 of FIG. 5 can automatically adjust the value of k by detecting small changes between successive values of the gain parameter MS. An alternative method would be to detect inputs to the accumulator near zero, but this latter method does not enjoy the averaging effects of the accumulator. Referring to FIG. 5, the $ACC_N$ block 150 represents the accumulator of FIG. 4. The expanded accumulator 250 takes the difference between successive outputs of the accumulator $ACC_N$ 150. The modified error signal Δ' enters a manipulation block 152 under the control of the k select block 160 such that the number of higher significant bits set to zero equals k, as determined by the k select block 160. In this manner, the accumulator $ACC_N$ 150 receives a bit stream in which the k most significant bits are set to zero and the remaining lower significant bits are the modified error signal Δ'. The bit stream entering the $ACC_N$ 150 is shown in FIG. 5 as the zeros on top to represent zeros as more significant bits.

The function of the expanded accumulator 250 is to evaluate outputs of the accumulator $ACC_N$ 150, which is the gain parameter MS, and determine when the values are converging. In other words, taking the differences of sequential values $MS_{j-1}$ and $MS_j$ coming out of the accumulator $ACC_N$ 150 and as the difference, $MS_{j-1}-MS_j$, goes to zero, this provides implied information that the input, error signal Δ, has gone to zero. Averaging can also be used such that the difference between each successive output MS is not evaluated, but instead some period of measurement, for example every $16^{th}$ MS, is evaluated.

Each block R represents a clocked register. Each sequential value of MS is output from the accumulator $ACC_N$ 150 and stored in a register R 154 such that during a subsequent cycle, the current value, $MS_j$, output from the accumulator 150 is compared to the previously stored value, $MS_{j-1}$. The difference between these two values, $MS_{j-1}$ and $MS_j$, is determined by logic circuit 156 and stored in a shift register 158, represented as the series of R blocks in FIG. 5. The k select block 160 evaluates the difference to determine if the value of k is to be adjusted. The closer the values of $MS_{j-1}$ and $MS_j$, the closer the accumulator $ACC_N$ 150 is to convergence. Based on design parameters included within the k select block 160, if the determined difference is within a predetermined range, then the accumulator $ACC_N$ 150 is slowed down. The accumulator $ACC_N$ 150 is slowed by increasing the value of k, which coincides with more higher significant bits (k) being set to zero. In this manner, the expanded accumulator 250, shown in FIG. 5 acts as a throttle mechanism for the accumulator $ACC_N$ 150. When the accumulator $ACC_N$ 150 has sufficiently converged on a value MS, the speed by which the accumulator $ACC_N$ 150 subsequently converges is slowed by adding more higher order zeros (increase the value of k). This mechanism can also be used to speed up the accumulator 150 by decreasing the value k.

Occasion for slowing the accumulator $ACC_N$ 150 might occur when the determined difference is essentially noise. In operation, the impact of noise forces the value of MS to wander. The auxiliary modulation loop, including the accumulator $ACC_N$ 150 is continuously attempting to converge on a fixed value for the gain parameter MS, while noise in the system acts to disrupt this convergence. It is observed that the noise contributes in small increments to the disruption of the convergence whereas if the error signal Δ is still significantly large, then convergence towards the gain parameter MS occurs in fairly large steps for a given time period. When the error signal Δ becomes insignificantly small, the input to the accumulator $ACC_N$ 150 is also becoming very small, and the accumulator $ACC_N$ 150 is no longer taking large steps towards convergence. When such a condition occurs, the accumulator $ACC_N$ 150 is responding primarily to noise, and there is no need for the accumulator $ACC_N$ 150 to respond as quickly. Therefore, the accumulator $ACC_N$ 150 is made less responsive by increasing the value of k, as described above. This acts to smooth out the impact of the noise.

Figure 6:
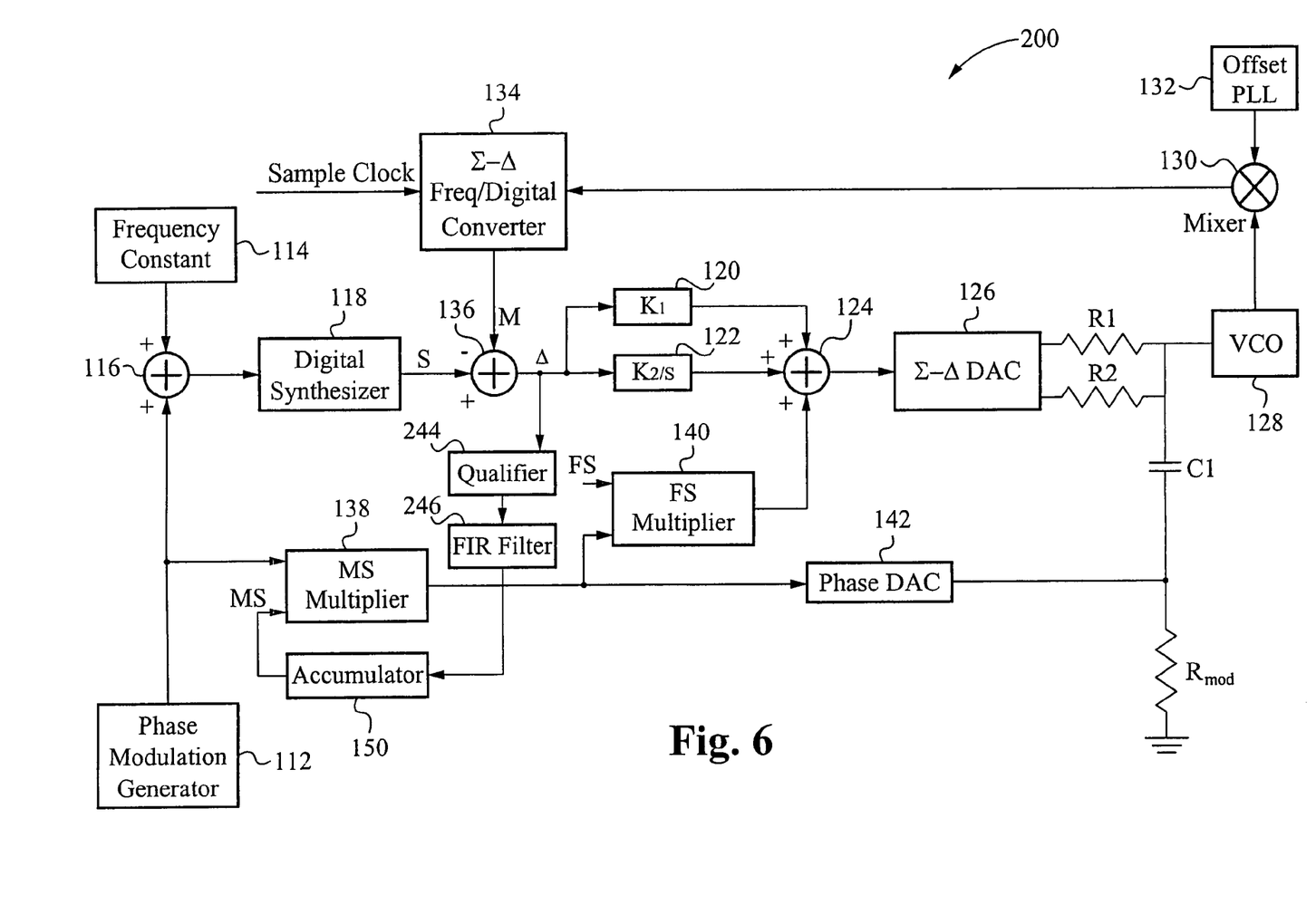
FIG. 6 illustrates a block diagram of another dual path angle modulator.

FIG. 6 illustrates a block diagram of another dual path angle modulator. The dual path angle modulator 200 of FIG. 6 is similar to the first embodiment of the dual path angle modulator 100 of FIG. 3 with the exception that a qualifier circuit 244 and finite input response (FIR) filter 246 replace the gate 144 of FIG. 3. The intent of the gate is that there is some kind of conditioning applied to an input, such as the error signal Δ. The function of the qualifier circuit 244 and the FIR filter 246 is more complicated than a gate. The qualifier circuit 244 measures the magnitude of the actual modulation, and only outputs those signals that fall within a particular range. The range and time of the input error signal Δ are limited using the qualifier 244. In general, the qualifier circuit 244 refers to any type of circuit that functions to condition an input signal. Then, the FIR filter 246 only filters those selected values of the error signal Δ that are output from the qualifier 244. Convergence using the second embodiment of the dual path angle modulator 200 is slower than the dual path angle modulator 100 of the first embodiment, which is desirable in certain situations, e.g. the presence of a high amount of noise.

The qualifier circuit 244 and the FIR filter 246 in FIG. 6 is similar to the functionality of the gate 144 in FIG. 3, although the hardware is not related. Using the gate 144 in FIG. 3, input error signal Δ is not being qualified, as is the qualifier circuit 244 and the FIR filter 246 in FIG. 6, so the gate 144 is exposed to all measurements. This is the primary difference between the gate 144 and the qualifier circuit 244 and the FIR filter 246 combination.

Using an FIR filter 246, samples of the error signal Δ are filtered using FIR structures and block operation is possible providing decimation. Due to the ΣΔ properties in the waveforms used for signals S and M, initially filtering error signal Δ is a natural choice. Using the qualifier circuit 244 and the FIR filter 246, the accumulator 150 determines the value of MS according to:

$$\text{Running operation } MS_{j+1} = MS_j + \alpha \sum_{i=0}^{N-1} \Delta_{j-i} h_i$$

$$\text{Block operation } MS_{j+1} = MS_j + \alpha \sum_{i=0}^{N-1} \Delta_{n-i} h_i$$

Running operation refers to processing a continuous stream of data. Block operation refers to processing of a block or blocks of data.

N samples of the error signal Δ are used to calculate each update of the index j. Qualifiers are used on the $\Delta_n$'s. The variable h refers to the coefficients of the particular FIR filter. Use of this input filtering reduces the filtering requirements on the accumulator 150, allowing the accumulator 150 to run slower and have fewer bits in its construction. Acquisition of the gain parameter MS is somewhat slower, however the structure is more tolerant of noise.

In an alternative embodiment, the FIR filter 246 is replaced by an infinite input response (IIR) filter. Using an IIR filter, the error signals Δ are filtered using IIR structures. The feedback used in IIR structures suggests against the use of block operations. Using the qualifier/IIR filter, the accumulator 150 determines the value of MS according to:

$$MS_{j+1} = MS_j + \alpha \sum_{i=0}^{N-1} \Delta_{j-i} b_i \bigg/ \sum_{i=0}^{N-1} \Delta_{j-i} c_i$$

In yet another alternative embodiment, modulation is modified using methods similar to those in Least-Mean-Square (LMS) adaptive algorithms. In this alternative embodiment, the gate 144 is eliminated, such as the THROUGH gate option described above, and the accumulator 150 is configured to use the LMS adaptive algorithm. Using the LMS adaptive algorithm, the accumulator 150 determines the value of MS according to:

$$MS_{j+1} = MS_j - \mu F(S_j) g(\Delta)_j$$

Possibilities for the signal function $F(S_j)$ include a linear scaling $F(S_j)=\beta S_j$, exponential non-linearity $F(S_j)=S_j^n$, and so on. The function $g(\Delta)_j$ is a general transfer function dependent upon the specific LMS adaptive algorithm.

In operation, the dual path angle modulator of the present application includes a main control loop that is configured as a primary path to process the low frequency portion of the phase modulation signal, and an auxiliary modulation loop is configured as secondary path to process the high frequency portions of the phase modulation signal. The auxiliary modulation loop receives an error signal Δ that represents the difference between an output signal of the main control loop and a desired input modulation signal. The error signal Δ is manipulated and/or filtered before being input to an accumulator as a modified error signal Δ'. The accumulator accumulates the values of the modified error signals Δ'. The value of the accumulator is used as a gain parameter MS, which is used to normalize the gain within both the main control loop and the auxiliary modulation loop. The error signals Δ are continuously determined and used to update the gain parameter MS within the accumulator. In this manner, the dual path angle modulator continuously calibrates both paths as a background process.

The first and second embodiments of the dual path angle modulator indicate that the error signal Δ can be manipulated and filtered using any type of gate, as in the first embodiment, or using a qualifier and FIR filter, as in the second embodiment. It is understood that the dual path angle modulator can manipulate and/or filter the error signal Δ using any other appropriate conventional type of circuitry.

It is understood that although the angle or phase modulator is described above as a dual path modulator, the angle of phase modulator can be implemented to include more than two paths. In general, the angle of phase modulator is a multi-path angle or phase modulator.

The present application has been described in terms of specific embodiments incorporating details to facilitate the understanding of the principles of construction and operation of the multiple path angle modulator. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

We claim:
1. A modulating circuit comprising:
 a. a phase control loop to output an analog angle modulation signal in response to an input desired angle modulation signal, wherein the phase control loop includes:
  i. a difference logic circuit to receive as input a first bit stream representing the desired angle modulation signal and a second bit stream representing the analog angle modulation signal and to output an output bit stream representing a difference quantity between the first bit stream and the second bit stream; and
  ii. a controlled oscillator to output the analog angle modulation signal; and
 b. a modulating loop coupled to receive the output bit stream from the difference logic circuit and coupled to an input terminal of the controlled oscillator, wherein the modulation loop includes:
  i. a modulation gain circuit, including a gate circuit to adjust the output bit stream and an accumulator to generate a gain parameter based on the output bit stream adjusted by the gate circuit, to automatically output the generated gain parameter; and
  ii. a multiplier to receive as input the gain parameter and as input the first input bit stream representing the desired angle modulation signal and to output a calibrating modulation signal to the input terminal of the controlled oscillator.

2. The modulating circuit of claim 1 wherein the phase control loop further comprises a control circuit to receive the output bit stream from the difference logic circuit and to output a filtered analog difference signal.

3. The modulating circuit of claim 2 wherein the input terminal of the controlled oscillator includes a summing circuit to receive as input the filtered analog difference signal from the control circuit and the calibrating modulation signal from the multiplier.

4. The modulating circuit of claim 1 wherein the gain parameter comprises an accumulated value within the accumulator representative of the accumulated difference quantities output by the difference logic circuit.

5. The modulating circuit of claim 1 wherein the gate circuit comprises an exclusive OR gate.

6. The modulating circuit of claim 1 wherein the gate circuit comprises an AND gate.

7. The modulating circuit of claim 1 wherein the accumulator is configured to adjust a rate by which the difference quantity converges towards zero.

8. The modulating circuit of claim 1 wherein the gate circuit utilizes an absolute value of a magnitude of the difference quantity output by the difference logic circuit.

9. The modulating circuit of claim 1 wherein the gate circuit comprises a qualifier and a FIR filter.

10. The modulating circuit of claim 1 wherein the modulation gain circuit comprises an accumulator.

11. A modulating circuit comprising:
 a. a phase control loop to output an analog angle modulation signal in response to an input desired angle modulation signal, wherein a forward portion of the phase control loop includes:
  i. a control circuit to receive as input a bit stream representing a difference quantity between the analog angle modulation signal and the desired angle modulation signal and to output a filtered analog difference signal; and
  ii. a controlled oscillator to output the analog angle modulation signal; and b. a modulating loop coupled to the forward portion of the phase control loop, wherein the modulation loop includes:
  i. a modulation gain circuit to receive the bit stream representing the difference quantity between the analog angle modulation signal and the desired angle modulation signal and to automatically output a gain parameter, the modulation gain circuit including a gate circuit and an accumulator; and
  ii. a multiplier to receive as input the gain parameter and an input bit stream representing the desired angle modulation signal and to output a calibrating modulation signal,
wherein the controlled oscillator receives as input the calibrating modulation signal and the filtered analog difference signal.

12. The modulating circuit of claim 11 wherein the forward portion of the phase control loop further comprises a summing circuit to receive the calibrating modulation signal and the filtered analog difference signal and to output a controlling signal to the controlled oscillator.

13. The modulating circuit of claim 11 wherein the phase control loop includes a difference logic circuit to receive as input a first bit stream representing the desired angle modulation signal and a second bit stream representing the analog angle modulation signal and to output the output bit stream representing the difference quantity between the analog angle modulation signal and the desired angle modulation signal to the control circuit.

14. The modulating circuit of claim 11 wherein the gain parameter comprises an accumulated value within the accumulator representative of the accumulated difference quantities output by the difference logic circuit.

15. The modulating circuit of claim 11 wherein the gate circuit comprises an exclusive OR gate.

16. The modulating circuit of claim 11 wherein the gate circuit comprises an AND gate.

17. The modulating circuit of claim 11 wherein the accumulator is configured to adjust a rate by which the difference quantity converges towards zero.

18. The modulating circuit of claim 11 wherein the gate circuit utilizes an absolute value of a magnitude of the difference quantity output by the difference logic circuit.

19. The modulating circuit of claim 11 wherein the gate circuit comprises a qualifier and a FIR filter.

20. The modulating circuit of claim 11 wherein the modulation gain circuit comprises an accumulator.

21. A modulating circuit comprising:
  a. a controlled oscillator to output an analog angle modulation signal;
  b. a digital synthesizer to receive an input desired angle modulation signal and to output a first digital bit stream representing the desired angle modulation signal;
  c. a difference logic circuit coupled to receive the first digital bit stream from the digital synthesizer and a second digital bit stream representing the analog angle modulation signal, wherein the difference logic circuit outputs an output bit stream representing a difference quantity between the analog angle modulation signal and the desired angle modulation signal;
  d. a control circuit coupled to the difference logic circuit to receive the output bit stream, wherein the control circuit outputs a filtered analog difference signal;
  e. a modulation gain circuit coupled to the difference logic circuit to receive the output bit stream, wherein the modulation gain circuit outputs a gain parameter the modulation gain circuit including a gate circuit and an accumulator;
  f. a multiplier coupled to receive an input bit stream representing the desired angle modulation signal and coupled to the modulation gain circuit to receive the gain parameter, wherein the multiplier outputs a calibrating modulation signal; and
  g. a summing circuit coupled to the control circuit to receive the filtered analog difference signal and coupled to the multiplier to receive the calibrating modulation signal, wherein the summing circuit outputs a control signal to the controlled oscillator.

22. The modulating circuit of claim 21 wherein the controlled oscillator, the difference logic circuit, the control circuit, and the summing circuit form a phase control loop.

23. The modulating circuit of claim 22 wherein the output bit stream from the difference logic circuit drives a forward path of the phase control loop.

24. The modulating circuit of claim 23 wherein the difference logic circuit, the modulation gain circuit, the multiplier, and the summing circuit form a modulation loop.

25. The modulating circuit of claim 24 wherein the modulation loop is coupled to the forward path of the phase control loop.

26. The modulating circuit of claim 25 wherein the modulation gain circuit automatically determines the modulation gain such that a direct modulation gain of the phase control loop and a gain of the modulation loop are substantially equal.

27. The modulating circuit of claim 21 wherein the accumulator outputs the gain parameter.

28. The modulating circuit of claim 21 wherein an accumulated value representative of the accumulated difference quantities output by the difference logic circuit comprises the gain parameter.

29. The modulating circuit of claim 21 wherein the gate circuit comprises an exclusive OR gate.

30. The modulating circuit of claim 29 wherein the exclusive OR gate utilizes a sign and a magnitude of the difference quantity output by the difference logic circuit.

31. The modulating circuit of claim 21 wherein the gate circuit comprises an AND gate.

32. The modulating circuit of claim 31 wherein the AND gate utilizes a positive magnitude of the difference quantity output by the difference logic circuit.

33. The modulating circuit of claim 31 wherein the AND gate utilizes a negative magnitude of the difference quantity output by the difference logic circuit.

34. The modulating circuit of claim 21 wherein the accumulator is configured to adjust a rate by which the difference quantity converges towards zero.

35. The modulating circuit of claim 21 wherein the gate circuit utilizes an absolute value of a magnitude of the difference quantity output by the difference logic circuit.

36. The modulating circuit of claim 21 wherein the gate circuit comprises a qualifier and a FIR filter.

37. The modulating circuit of claim 21 wherein the modulation gain circuit comprises an accumulator.

38. The modulating circuit of claim 21 wherein the difference logic circuit outputs a signal representing at least one of a frequency difference and a phase difference between the desired angle modulation signal and the analog angle modulation signal.

39. The modulating circuit of claim 21 wherein the desired angle modulation signal comprises a wideband angular modulation signal.

40. A modulating circuit comprising:
a. means for generating an analog angle modulation signal;
b. means for generating an output bit stream representing a difference quantity between the analog angle modulation signal and an input desired angle modulation signal;
c. means for adapting the output bit stream into a filtered analog difference signal;
d. means for automatically determining a gain parameter in response to the output bit stream, said means for automatically determining a gain parameter including a gate circuit and an accumulator;
e. means for multiplying the input desired angle modulation signal by the gain multiplier to generate a calibrating modulation signal; and
f. means for combining the calibration modulation signal and the filtered analog signal into an input signal for the means for generating the analog angle modulation signal, wherein the means for generating the analog angle modulation signal generates the analog angle modulation signal in response to the input signal.

41. A modulating circuit comprising:
a. a controlled oscillator to output an analog angle modulation signal;
b. a digital synthesizer to receive an input desired angle modulation signal and to output a first digital bit stream representing the desired angle modulation signal;
c. a difference logic circuit coupled to receive the first digital bit stream from the digital synthesizer and a second digital bit stream representing the analog angle modulation signal, wherein the difference logic circuit outputs an output bit stream representing a difference quantity between the analog angle modulation signal and the desired angle modulation signal;
d. a control circuit coupled to the difference logic circuit to receive the output bit stream, wherein the control circuit outputs a filtered analog difference signal;
e. a modulation gain circuit coupled to the difference logic circuit to receive the output bit stream, the modulation gain circuit having an exclusive OR gate and an accumulator and the modulation gain circuit outputting a gain parameter;
f. a multiplier coupled to receive an input bit stream representing the desired angle modulation signal and coupled to the modulation gain circuit to receive the gain parameter, wherein the multiplier outputs a calibrating modulation signal; and
g. a summing circuit coupled to the control circuit to receive the filtered analog difference signal and coupled to the multiplier to receive the calibrating modulation signal, wherein the summing circuit outputs a control signal to the controlled oscillator; and
wherein the exclusive OR gate utilizes a sign and a magnitude of the difference quantity output by the difference logic circuit.

42. A modulating circuit comprising:
a. a controlled oscillator to output an analog angle modulation signal;
b. a digital synthesizer to receive an input desired angle modulation signal and to output a first digital bit stream representing the desired angle modulation signal;
c. a difference logic circuit coupled to receive the first digital bit stream from the digital synthesizer and a second digital bit stream representing the analog angle modulation signal, wherein the difference logic circuit outputs an output bit stream representing a difference quantity between the analog angle modulation signal and the desired angle modulation signal;
d. a control circuit coupled to the difference logic circuit to receive the output bit stream, wherein the control circuit outputs a filtered analog difference signal;
e. a modulation gain circuit coupled to the difference logic circuit to receive the output bit stream, the modulation gain circuit having an AND gate and an accumulator and the modulating gain circuit outputting a gain parameter;
f. a multiplier coupled to receive an input bit stream representing the desired angle modulation signal and coupled to the modulation gain circuit to receive the gain parameter, wherein the multiplier outputs a calibrating modulation signal; and
g. a summing circuit coupled to the control circuit to receive the filtered analog difference signal and coupled to the multiplier to receive the calibrating modulation signal, wherein the summing circuit outputs a control signal to the controlled oscillator;
wherein the AND gate utilizes a positive magnitude of the difference quantity output by the difference logic circuit.

43. A modulating circuit comprising:
a. a controlled oscillator to output an analog angle modulation signal;
b. a digital synthesizer to receive an input desired angle modulation signal and to output a first digital bit stream representing the desired angle modulation signal;
c. a difference logic circuit coupled to receive the first digital bit stream from the digital synthesizer and a second digital bit stream representing the analog angle modulation signal, wherein the difference logic circuit outputs an output bit stream representing a difference quantity between the analog angle modulation signal and the desired angle modulation signal;
d. a control circuit coupled to the difference logic circuit to receive the output bit stream, wherein the control circuit outputs a filtered analog difference signal;
e. a modulation gain circuit coupled to the difference logic circuit to receive the output bit stream, the modulation gain circuit having an AND gate and an accumulator and the modulating gain circuit outputting a gain parameter;
f. a multiplier coupled to receive an input bit stream representing the desired angle modulation signal and coupled to the modulation gain circuit to receive the gain parameter, wherein the multiplier outputs a calibrating modulation signal; and
g. a summing circuit coupled to the control circuit to receive the filtered analog difference signal and coupled to the multiplier to receive the calibrating modulation signal, wherein the summing circuit outputs a control signal to the controlled oscillator;
wherein the AND gate utilizes a negative magnitude of the difference quantity output by the difference logic circuit.

* * * * *

UNITED STATES PATENT AND TRADEMARK OFFICE
CERTIFICATE OF CORRECTION

PATENT NO. : 7,636,386 B2 Page 1 of 1
APPLICATION NO. : 11/280665
DATED : December 22, 2009
INVENTOR(S) : McCune, Jr. et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1041 days.

Signed and Sealed this

Ninth Day of November, 2010

David J. Kappos
*Director of the United States Patent and Trademark Office*